United States Patent [19]
Lewis et al.

[11] Patent Number: 4,611,238
[45] Date of Patent: Sep. 9, 1986

[54] INTEGRATED CIRCUIT PACKAGE INCORPORATING LOW-STRESS OMNIDIRECTIONAL HEAT SINK

[75] Inventors: Terrence E. Lewis; Stephen A. Smiley, both of San Diego; Rex Rice, Menlo Park; Zeev Lipkes, Poway; John A. Nelson, San Diego, all of Calif.

[73] Assignee: Burroughs Corporation, Detroit, Mich.

[21] Appl. No.: 754,686

[22] Filed: Jul. 15, 1985

Related U.S. Application Data

[63] Continuation-in-part of Ser. No. 646,478, Aug. 31, 1984, abandoned, which is a continuation of Ser. No. 375,069, May 5, 1982, abandoned.

[51] Int. Cl.⁴ ............................................. H01L 23/36
[52] U.S. Cl. .................................. 357/81; 174/16 HS
[58] Field of Search ...................... 357/81; 174/16 HS

[56] References Cited

U.S. PATENT DOCUMENTS

| | | | |
|---|---|---|---|
| 2,712,102 | 6/1955 | Bacon | 357/81 X |
| 2,713,655 | 7/1955 | Grubman | 357/81 |
| 2,897,419 | 7/1959 | Howland et al. | 357/79 |
| 3,195,628 | 7/1965 | McAdam | 357/81 X |
| 3,212,569 | 10/1965 | McAdam | 357/81 X |
| 3,412,788 | 11/1968 | Pomerantz | 357/81 X |
| 3,836,825 | 9/1974 | Hall et al. | 357/81 |
| 4,004,195 | 1/1977 | Hacayda et al. | 357/81 |
| 4,340,902 | 7/1982 | Honda | 357/80 |
| 4,415,025 | 11/1983 | Horvath | 357/79 |

OTHER PUBLICATIONS

AHAM, Summer 1977 catalogue.

Primary Examiner—Martin H. Edlow
Assistant Examiner—Jerome Jackson, Jr.
Attorney, Agent, or Firm—Charles J. Fassbender; Kevin R. Peterson

[57] ABSTRACT

Disclosed is a heat sink for cooling an integrated circuit package. The heat sink comprises a single thin sheet of material having two oppositely facing major surfaces. These two major surfaces have a common perimeter defining a plurality of spaced-apart finger-shaped portions of the thin sheet of material that extend radially from a central portion of the sheet. The central portion is convex for attachment to the integrated circuit package; and the finger-shaped portions are formed to extend out of the plane of the central portion to become cooling fins for the central portion.

11 Claims, 14 Drawing Figures

Fig. 6A

| | Fig. 4 EMBODIMENT | Fig. 3 PRIOR ART EMBODIMENT | Fig. 7C EMBODIMENT |
|---|---|---|---|
| 40～NUMBER OF PARTS TESTED | 20 | 20 | 30 |
| 41～TEMP. CYCLE (～) FAILURES | ZERO FAIL AFTER 200～ | ALL FAIL AFTER 80～ | ZERO FAIL AFTER 200～ |
| 42～HEAT SINK THICKNESS (Inches) | 0.030 | 0.155 | 0.030 |
| 43～HEAT SINK ATTACH AREA (Sq. Inches) | 0.10 | 0.37 | 0.20 |
| 44～HEAT SINK MATERIAL | COPPER | ～～～→ | |
| 45～HEAT SINK ATTACH MATERIAL | 293-IT EPOXY | ～～～→ | |
| 46～LID ATTACH MATERIAL | KC402 GLASS | ～～～→ | |

Fig. 6B

| | Fig. 4 EMBODIMENT | Fig. 3 PRIOR ART EMBODIMENT | Fig. 7C EMBODIMENT |
|---|---|---|---|
| 50～NUMBER OF PARTS TESTED | 20 | ✕ | 30 |
| 51～THERMAL SHOCK FAILURES | ZERO FAIL AFTER 15 CYCLES | ✕ | ZERO FAIL AFTER 15 CYCLES |

Fig. 6C

| | Fig. 4 EMBODIMENT | Fig. 3 PRIOR ART EMBODIMENT | Fig. 7C EMBODIMENT |
|---|---|---|---|
| 60～NUMBER OF PARTS TESTED | 10 | 10 | 10 |
| 61～θJA (°C/WATT)/STD DEV. | 22.0/1.2 | 21.2/2.0 | 20.9/2.1 |
| 62～AIRFLOW (LFPH) | 300 | ～～～→ | |
| 63～POWER (WATTS) | 2.4 | ～～～→ | |
| 64～HEAT SINK HEIGHTH (Inches) | 0.155 | ～～～→ | |
| 65～HEAT SINK WIDTH (Inches) | 0.810 | ～～～→ | |
| 66～HEAT SINK THICKNESS (Inches) | 0.030 | 0.155 | 0.030 |
| 67～HEAT SINK ATTACH. AREA (Sq. Inches) | 0.10 | 0.37 | 0.20 |
| 68～HEAT SINK MATERIAL | COPPER | ～～～→ | |
| 69～HEAT SINK ATTACH MATERIAL | SOLDER | ～～～→ | | eq. 1. $\Delta L_{HS} = K_{HS} L_0 \Delta T$ eq. 2. $\Delta L_{SUB} = K_{SUB} L_0 \Delta T$ eq. 3. $D = (K_{HS} - K_{SUB}) L_0 \Delta T$ eq. 4. $SS = G\Theta$ eq. 5. $\Theta \approx \dfrac{D}{t}$ eq. 6. $SS = G \dfrac{(K_{HS} - K_{SUB}) L_0 \Delta T}{t}$ eq. 7. $SS \propto \dfrac{L_0}{t}$

INTEGRATED CIRCUIT PACKAGE INCORPORATING LOW-STRESS OMNIDIRECTIONAL HEAT SINK

This is a continuation-in-part of co-pending application Ser. No. 646,478 filed on Aug. 31, 1984, which is a continuation of Ser. No. 375,069 filed May 5, 1982, both abandoned

BACKGROUND OF THE INVENTION

This invention relates to the art of packaging and cooling integrated circuits.

One commonly used integrated circuit package of the prior art is illustrated in cross section in FIG. 1 where it is identified by reference numeral 10. Some of the major components of this package 10 are a substrate 11, a lid 12, a plurality of conductive leads 13, and an integrated circuit chip 14.

As FIG. 1 shows, substrate 11 is rectangular in cross section. Also, it has a top major surface 11a and a bottom major surface 11b. Surface 11a has a cavity near its center which is shaped to receive chip 14. Surface 11b, by comparison, is merely flat.

A plurality of electrical conductors 11d lie within substrate 11 between the periphery of cavity 11c and the periphery of surface 11a. At the periphery of cavity 11c, electrical connections are made between the conductors 11d and chip 14 by a plurality of bonding wires 15. At the periphery of surface 11a, the conductors 11d contact the leads 13 directly which in turn extend from surface 11a to make electrical connections to an external system (not shown).

Lid 12 overlies cavity 11c and is rigidly attached to surface 11a at the periphery of the cavity by a lid attach material 16. This lid attach material 16 together with lid 12 and substrate 11 thus provide a hermetic enclosure for chip 14.

One specific example of the materials and their dimensions in the above-described circuit package is as follows: Substrate 11 is made of ceramic; and it has a length of 0.950 inches, a width of 0.950 inches, and a height of 0.060 inches. Chip 14 is made primarily of silicon; and it has a length of 0.300 inches, a width of 0.300 inches, and a thickness of 0.020 inches. Lid 12 is made of ceramic; and it has a length of 0.580 inches, a width of 0.580 inches, and a thickness of 0.030 inches. And the lid attach material 16 is made of a layer of glass having a thickness of 0.002 inches.

When chip 14 in package 10 is of the type that uses a relatively small amount of power (e.g., less than one watt), then no heat sink needs to be attached to the package. However, as the amount of power which chip 14 uses increases, a point is eventually reached at which a heat sink must be attached to the package in order to insure that chip 14 does not overheat.

Conventionally, the heat sink is made of metal, such as copper or aluminum; and it is rigidly attached by an epoxy or a solder to surface 11b directly below chip 14. During the attachment process, the epoxy or solder is heated to a fluid state whereupon it is dispersed in a thin smooth layer between surface 11b and the heat sink. Thereafter, the epoxy or solder is allowed to cool and harden.

However, this cooling and hardening step also induces stresses in the package, and particularly in the lid attach material 16. These stresses vary in magnitude with the overall shape of the particular heat sink that is being attached. And, depending on the shape of the heat sink, the stresses can become so large as to cause cracks in the lid attach material 16. When this occurs, the hermetic seal for chip 14 is broken which makes the package inoperable.

To further understand how the heat sink induces stresses in the lid attach material 16, reference should now be made to FIG. 2. That Figure contains a graph wherein the temperature of the integrated circuit package is plotted on a horizontal axis, and stress in the lid attach material 16 is plotted on a vertical axis. In this graph, a curve 21 illustrates how stress in the lid attach material 16 varies as a function of temperature under the condition where no heat sink is attached to package 10; while another curve 22 shows how stress in the lid attach material 16 varies under the conditions where a heat sink is attached to package 10.

Curves 21 and 22 begin at a temperature $T_{LID}$, which is the temperature at which the lid attach material solidifies. For example, temperature $T_{LID}$ is approximately 320° C. when the lid attach material is glass. In order to attach lid 12 to surface 11a, the lid attach material must be heated above temperature $T_{LID}$, and typically it is heated to 420° C. Thereafter, the package is cooled to room temperature $T_{RT}$.

During this cooling, both substrate 11 and lid 12 contract. But this contraction induces only relatively small stresses in the attach material 16, becaues both lid 12 and substrate 11 are made of essentially the same material and thus they contact at nearly equal rates.

Thereafter, package 10 is reheated to attach the heat sink to surface 11b. In this step, the temperature to which the package is heated must exceed the solidification temperature $T_{HS}$ of the heat sink attach material. For example, the temperature for solder is about 183° C., and for an epoxy is about 150° C.

So long as the heat sink attach material remains liquid, the stresses induced in the lid attach material 16 remain relatively small. However, once the heat sink attach material solidifies at temperature $T_{HS}$, the stresses in the lid attach material 16 rapidly increase. This rapid increase in stress is due to the fact that the heat sink contracts much more rapidly than the ceramic substrate. For example, the coefficients of thermal expansion for copper and aluminum respectively are about 2.6 and 3.6 times the expansion coefficient of ceramic.

As the heat sink contracts, it tends to compress that portion of surface 11b to which the heat sink is attached. This in turn causes substrate 11 to bend in an arc-shaped fashion as illustrated in FIG. 3. In this Figure, the amount of bending is greatly exaggerated merely to illustrate the point that such bending actually does occur. This bending, in turn, causes the rapid increase in stress in the lid attach material 16.

After the heat sink is attached and the integrated circuit package is placed in an operating environment, the package is subjected to some predetermined range of operating temperatures. A typical maximum operating temperature, for example, is 125° C.; and a typical minimum operating temperature is −55° C. Such maximum and minimum operating temperatures are indicated in FIG. 2 as $T_{max}$ and $T_{min}$ respectively.

Curve 22 shows that at temperature $T_{max}$, the stress in lid attach material 16 is at a minimal level $S_{min}$; whereas at temperature $T_{min}$, the stress in lid attach material 16 is at a maximum level $S_{max}$. So in the operating environment, stress in the lid attach material varies between $S_{max}$ and $S_{min}$. And the magnitude of the maximum stress $S_{max}$ as well as any cycling between $S_{max}$ and $S_{min}$ frequently cause lid attach material to crack.

In addition, when the heat sink attach material solidifies at temperature $T_{HS}$, stress begins to occur at the interface between the heat sink and substrate 11. This stress, as with the stress in the lid attach material, is due to the fact that the heat sink contracts much more rapidly than substrate 11.

As the temperature decreases from $T_{HS}$ to $T_{RT}$, the stress at the substrate-heat sink interface rapidly increases. Thereafter, when the heat sink and integrated circuit package are placed in an operating environment and cycled between the temperatures $T_{min}$ and $T_{max}$, the stress at the substrate-heat sink interface cycles about a maximum value. Both the magnitude of that maximum value and the degree of cycling from it can produce cracks beteen the heat sink and substrate 11.

BRIEF SUMMARY OF THE INVENTION

Accordingly, one object of this invention is to provide an improved heat sink for an integrated circuit package.

Another object of this invention is to provide a heat sink which reduces the amount of thermal-mechanical stress that is induced in an integrated circuit package when the package and heat sink are rigidly attached and thermally cycled.

Still another object of this invention is to provide a heat sink which not only reduces cracking in an integrated circuit package to which the heat sink is attached, but also has superior cooling characteristics and is easy to manufacture.

In one embodiment of the invention, these and other objects are accomplished by a heat sink that is made of a single thin sheet of material having two oppositely facing major surfaces. These major surfaces have a common perimeter; and that common perimeter defines a plurality of spaced-apart finger-shaped portions of the heat sink that extend radially from a central portion. The central portion is flat and attaches to the integrated circuit package; whereas the finger-shaped portions bend out of the plane of the central portion to form cooling fins for the central portion.

Another embodiment of the invention is a heat sink that is made of a single thin sheet of material having two oppositely facing major surfaces with a common perimeter. But this embodiment also has a plurality of radially-oriented elongated slots having end walls at predetermined distances from a point that is centrally located within the perimeter. The end walls nearest the central point define a central portion of the heat sink; the end wall furthest from the central point together with the common perimeter define a ring-shaped portion around the central portion; and the side walls of the slots define a plurality of finger-shaped portions that connect the central portion to the ring-shaped portion. The central portion is flat and attaches to the integrated circuit package; whereas the finger-shaped portions are bent in one direction out of the plane of the central portion and together with the ring-shaped portion provide a means for cooling the central portion.

Additional embodiments of the invention are obtained by modifying both of the above described embodiments such that the central portion of the heat sink is convex shaped. This modification forces the adhesive which attaches the central portion of the heat sink to the integrated circuit package, to be thin at the center and progressively thicker towards the periphery of the central portion. As a result, thermally induced stress at the interface between the integrated circuit package and heat sink is subtantially reduced, heat transfer between the integrated circuit package and heat sink remains high, and no fixtures are required to set the thickness of the adhesive since it is fixed by the convex shape.

BRIEF DESCRIPTION OF THE DRAWINGS

Various features and advantages of the invention are described in the Detailed Description in conjunction with the accompanying drawings wherein:

FIGS. 6A–6C are a set of tables containing test data showing some of the superior features of the present invention over the prior art;

DETAILED DESCRIPTION OF THE INVENTION

Figure 4:
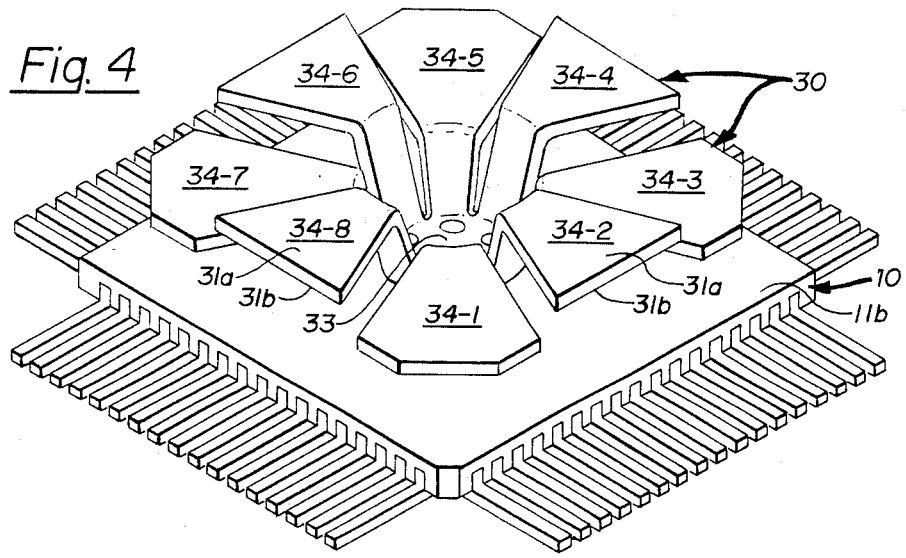
FIG. 4 is a pictorial view of one preferred embodiment of a heat sink constructed according to the invention.
Figure 5:
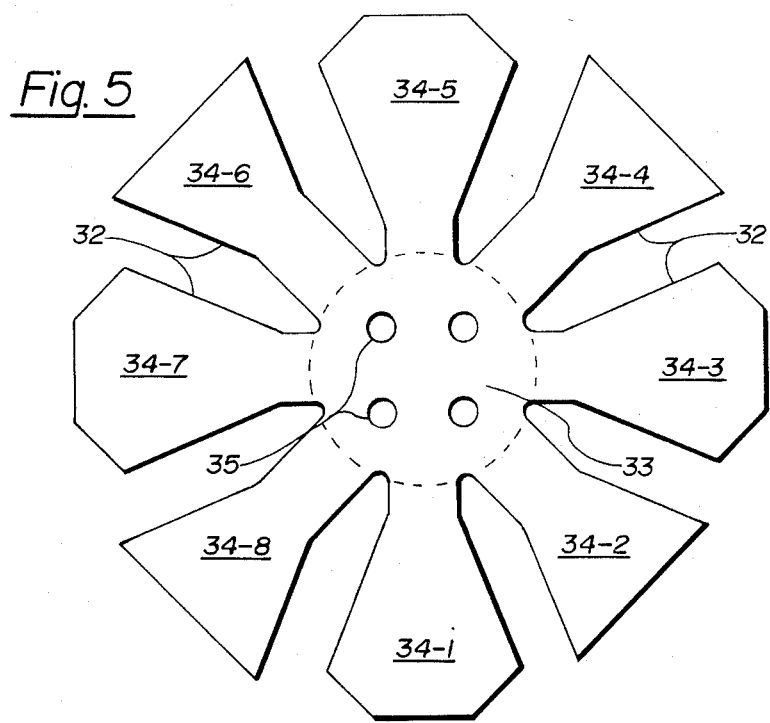
FIG. 5 is a planar view of the heat sink of FIG. 4 at an intermediate stage of its fabrication.

Referring now to FIGS. 4 and 5, one preferred embodiment of the invention will be described in detail. This particular embodiment is identified in FIGS. 4 and 5 by reference numeral 30. FIG. 4 illustrates heat sink 30 in a pictorial view which also shows the heat sink attached to surface 11b of the integrated circuit package 10 of FIG. 1. FIG. 5, by comparison, is a planar view of the heat sink 30 at an intermediate stage of its fabrication process.

Heat sink 30 consists of a single thin sheet of material having two oppositely facing major surfaces 31a and 31b. Surfaces 31a and 31b have a common perimeter 32. That perimeter 32 defines a plurality of spaced-apart finger-shaped portions 34 of the heat sink that extend radially from a central portion 33.

In the illustrated preferred embodiment of FIGS. 4 and 5, there are eight finger-shaped portions 34-1 through 34-8; and they are equally spaced around the central portion. As an alternative, however, the number of finger-shaped portions can be other than eight and preferably it is in the range of four to 18.

Heat sink 30 is fabricated from a single thin flat sheet of material that is rectangular-shaped. That rectangular-shaped material is stamped with a cutting tool having the above-described perimeter 32. FIG. 5 shows the flat sheet of material after this stamping step.

Thereafter, all of the finger-shaped portions are formed into a cylindrical shape such that the central portion 33 is at one end of the cylinder; and, the extremities of the finger-shaped portions are formed outward in a fan-like manner so as to reside in one or more planes parallel with the central portion 33. Suitably, these steps are performed by forming two bends of 60°–90° in each finger-shaped portion. Due to these bends, the finger-shaped portions 34-1 through 34-8 form cooling fins for the central portion 33. This is illustrated in FIG. 4.

Preferably, the distance between the two bends in adjacent finger-shaped portions varies in a cyclic fashion around the central portion 33. In other words, preferably the height of the open ends of the cooling fins alternates in a cyclic fashion around the central portion. This variance is height produces a turbulence in any airflow that passes through the cooling fins which enhances the heat sink's cooling capability.

Also preferably, a plurality of holes 35 are included in the central portion. These holes enhance the strength of the bond between the heat sink and package to which the heat sink is attached. In particular, the holes provide a means whereby any gas can escape from between the heat sink attach material and the integrated circuit package attach surface, and thus reduce voids in the heat sink attach material. Also, the holes provide a means for the heat sink attach material to seep through the central portion and bond to surface 31a around the holes' perimeter.

One specific example of the materials and dimensions in the above-described embodiment of the invention is as follows. Heat sink 30 is formed of a sheet of metal, such as copper or aluminum, which is 0.015 inches —0.045 inches thick. From such a sheet, the heat sink is stamped with the perimeter FIG. 5. Suitably, the radius for the central portion is 0.200 inches; the distance between the bends of fins 34-1, 34-3, 34-5, and 34-7 is 0.060 inches while the remaining length of those fins is 0.220 inches; the distance between the bends of fins 34-2, 34-4, 34-6, and 34-8 is 0.150 inches while the remaining length of those fins is 0.130 inches; and the holes 35 are equally spaced and have a radius of 0.020 inches.

Reference should now be made to FIGS. 6A, 6B, and 6C wherein various test results for the above-described heat sink of FIGS. 4 and 5 are given in three tables. These tables also contain other test results, for comparison purposes, for a heat sink of the prior art. FIG. 6A gives the results from a temperature-cycling test; FIG. 6B gives the results from a thermal shock test; and FIG. 6C gives the results from a cooling test.

Considering first the table of FIG. 6A, that table has seven rows 40–46, and three columns. The columns identify the heat sink under test as the "FIG. 4 Embodiment", "FIG. 3 Prior Art Embodiment", and "FIG. 7C Embodiment", whereas the rows list various test data. In the discussion that immediately follows, the FIG. 4 embodiment is compared to the prior art. Thereafter, the FIG. 7 embodiment (which is another embodiment of the invention) is compared to the prior art.

Figure 1:
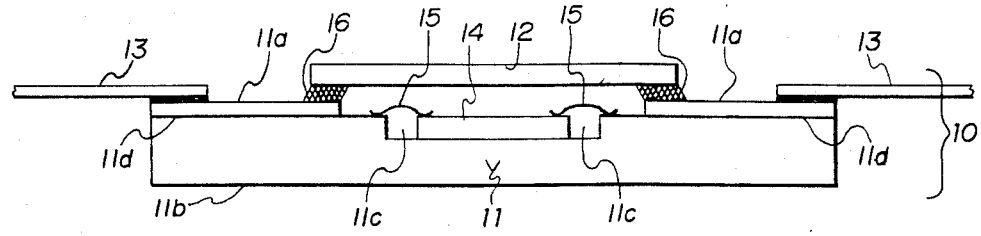
FIG. 1 is an enlarged cross-sectional view of a prior art integrated circuit package that is suitable for use with a heat sink of the present invention.
Figure 2:
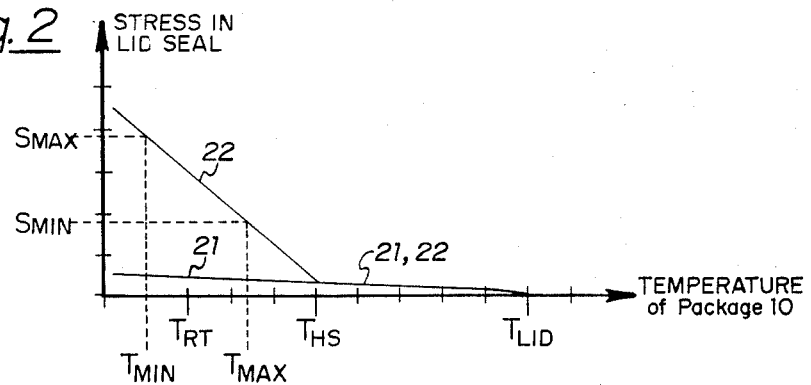
FIG. 2 is a graph illustrating the manner in which a heat sink of the prior art induces stress in the lid attach material of the FIG. 1 integrated circuit package.
Figure 3:
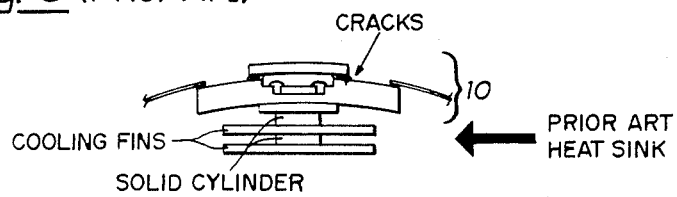
FIG. 3 is a schematic diagram illustrating how a heat sink of the prior art bends the FIG. 1 integrated circuit package.

In performing the temperature-cycling test of FIG. 6A, 20 heat sinks of the FIG. 4 type were attached to respective integrated circuit packages of the FIG. 1 type; and 20 prior art heat sinks of the FIG. 3 type were attached to identical integrated circuit packages. That prior art heat sink of FIG. 3, as made and sold by Thermalloy, Inc., was chosen because it has the very attractive feature of cooling with an omnidirectional air flow. Rows 42–46 in FIG. 6 list all of the physical parameters for the FIG. 4 heat sink and FIG. 3 heat sink which are relevant to the temperature-cycling test.

To conduct the temperature-cycling test, two separate chambers are provided. One of the chambers is filled with air at a temperature of 125° C.; and the other chamber is filled with air at −55° C. The integrated circuit packages with their attached heat sinks are moved in cyclic fashion between these two chambers; 15 minutes is spent in one chamber before the IC packages with their attached heat sinks are moved to the next chamber.

Inspection of row 41 shows that after 200 cycles, none of the 20 heat sinks of FIG. 4 caused any cracks in integrated circuit packages to which they were attached. By comparison, after only 80 cycles, all 20 of the prior art heat sinks of FIG. 3 caused cracks in the lid attach material of the packages to which they were attached.

To detect the presence or absence of a crack in the lid attach material, the tested parts are immersed in a radioactive gas. If cracks exist, some of the radioactive gas gets trapped in cavity 11c. Thereafter, the parts are removed from the gas and the presence or absence of any trapped particles is detected by a Geiger counter. Thus, the above tests are extremely accurate.

Next, consider the results of the thermal shock test in the table of FIG. 6B. In that table, the columns again identify the heat sinks under test, and the rows again identify particular test data. Note that all of the physical parameters of the heat sinks that were tested in the FIG. 6B thermal shock test are the same as those listed in rows 42–46 in FIG. 6A for the temperature cycle test.

To conduct the thermal shock test, two chambers are again provided; but this time they are filled with a liquid. In one of the chambers, the liquid is at a temperature of 125° C.; and in the other chamber, the liquid is at a temperature of −55° C. Again, the integrated circuit packages with their attached heat sinks are moved from chamber to chamber in a cyclic fashion. Five minutes is spent in one chamber, then five minutes is spent in another chamber, etc.

Row 50 in FIG. 6B shows that 20 heat sinks of the FIG. 4 embodiment were subjected to the thermal shock test. These heat sinks were again attached to the integrated circuit package of the FIG. 1 type. Row 51 shows that after 15 cycles, none of the FIG. 4 type heat sinks caused any cracks in the lids of the integrated circuit packages to which they were attached.

This thermal shock test is a more severe test than the above-described temperature-cycling test. Thus, none of the FIG. 3 type heat sinks were subjected to the thermal shock test since they could not even pass the temperature-cycling test.

Next, consider the results of the cooling test that are given in the table of FIG. 6C. Again in that table, the particular heat sinks that were tested are identified in the columns; and various test data is given in the rows 60–69.

Rows 64 and 65 show that the heat sinks under test have the same overall height and overall width. This is needed to make a fair comparison, since a heat sink's cooling ability generally increases as its size increases. Also, note that rows 68 and 69 show that the heat sinks under test were made of the same material, and were attached to their IC package via the same attach material.

Ten heat sinks of the FIG. 4 type were tested along with ten heat sinks of the FIG. 3 prior art type. Row 61 gives the average thermal resistance for all ten tested heat sinks of the same type, along with corresponding standard deviations from the average resistance. Inspection of row 61 shows that the average thermal resistance of the FIG. 4 type heat sink is within 0.8° C./W of the average thermal resistance of the FIG. 3 prior art type heat sink, and that the FIG. 4 heat sink has a smaller standard deviation. This means that both heat sinks have substantially the same cooling ability.

In summary then, the test results of FIGS. 6A, 6B, and 6C show the superiority of the FIG. 4 type heat sink in terms of its tendency to greatly reduce thermally induced stress in an integrated circuit package without sacrificing cooling ability. Also, the heat sink of FIG. 4 cools in an omnidirectional fashion; and this, of course, is important because it enables the integrated circuit packages to which the heat sinks are attached to be oriented in several different directions on a printed circuit board without impeding their cooling. Further, the heat sink of FIG. 4 is simple to manufacture as was explained in conjunction with FIG. 5. Those manufacturing steps merely include a stamping and bending operation; whereas by comparison, the prior art heat sink of FIG. 3 must be cut from rotating stock on a screw machine.

Turning now to FIGS. 7A-7D, various alternate preferred embodiments of the invention will be described. Beginning with FIG. 7A, the embodiment there illustrated is similar to the previously described embodiment of FIG. 4 in that it also is made of a single thin sheet of material having a common perimeter that defines a plurality of finger-shaped portions around a central portion. However, the FIG. 7A embodiment has a total of 12 finger-shaped portions (as opposed to eight finger-shaped portions in the FIG. 4 embodiment). Also, all of the finger-shaped portions in the FIG. 7A embodiment are bent such that their open ends lie at the same height above the central portion.

Figure 7A:
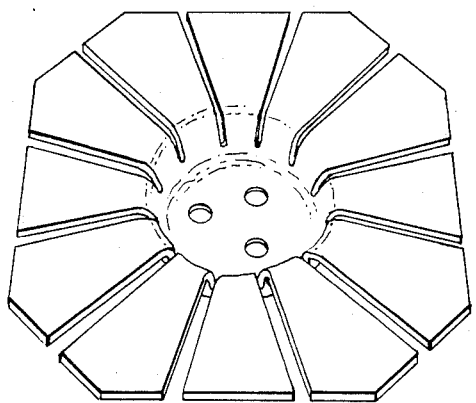
FIGS. 7A–7D are pictorial views of additional preferred embodiments of the present invention.
Figure 7B:
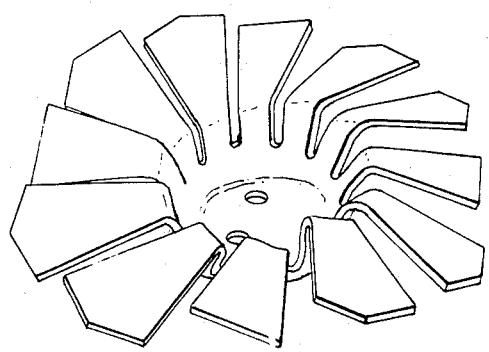

Next, consider the embodiment of FIG. 7B. It also is similar to the previously described embodiment of FIG. 4. However, it differs from the FIG. 4 embodiment in that the open ends of the finger-shaped portions are all twisted on their axis at a predetermined angle. Preferably, this angle is in the range of 0°-45°. These twisted open ends of the finger-shaped portions cause a turbulence in the air that passes through them which in turn enhances the heat sink's cooling action.

Figure 7C:
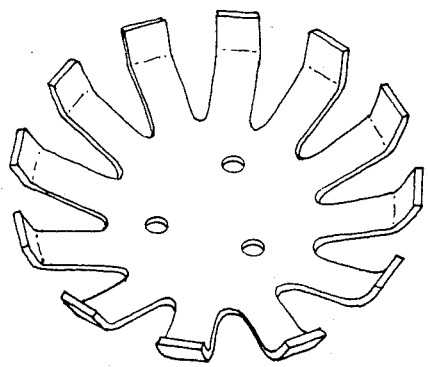

Consider next the embodiment of FIG. 7C. It differs from the FIG. 4 embodiment in that it has a total of 12 finger-shaped portions around the central portion; and in addition, the finger-shaped portions are bent in an arc-shaped fashion out of the plane of the central portion.

Figure 7D:
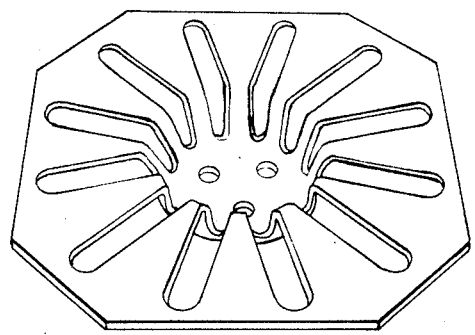

Finally, the FIG. 7D embodiment differs from the FIG. 4 embodiment in that the common perimeter of the heat sink does not define any central portion or finger-shaped portions at all. Instead, the FIG. 7D embodiment has a plurality of radially-oriented elongated slots each of which have a pair of end-walls at two predetermined distances from a point that is centrally located within the common perimeter. Those end-walls nearest the central point define the central portion of the heat sink; while those end-walls furthest from the central point together with the common perimeter define a ring-shaped portion around the central portion. Also, the side-walls of the slots which join the end-walls define a plurality of finger-shaped portions that connect the central portion to the ring-shaped portion. The central portion is flat and attaches to the integrated circuit package; whereas the fingers are bent out of the plane of the central portion, and together with the ring-shaped portion they provide a means for cooling the central portion.

All of the above-described FIG. 7A-7D embodiments are made by providing a thin rectangular-shaped sheet of material; stamping the heat sink from that sheet with a cutting tool having a perimeter the desired heat sink shape; and bending the stamped part in the manner illustrated in FIGS. 7A-7D.

Test results for the FIG. 7C embodiment are contained in the tables of FIGS. 6A, 6B, and 6C. Row 41 of FIG. 6A shows that 30 of the FIG. 7C type heat sinks were temperature cycled 200 times; and none of them caused any cracks in the IC package. Row 51 of FIG. 6B shows that 30 of the FIG. 7B type heat sinks were subjected to 15 thermal shock cycles; and again, none of them caused cracks in the IC package. Row 60 of FIG. 6C shows that ten of the FIG. 7C type heat sinks were tested for their thermal cooling ability; and they had an average thermal resistance which was lower than the prior art heat sink of FIG. 3.

Figures 8, 9:
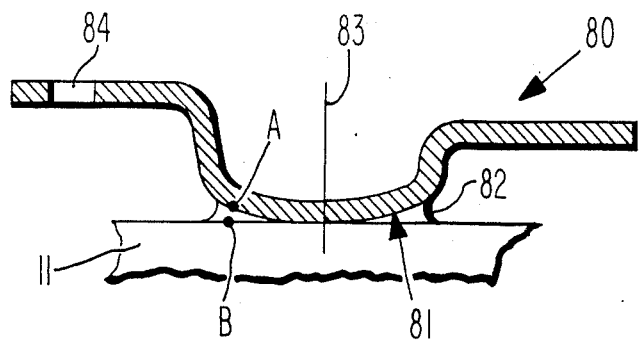
FIG. 8 is a cross-sectional drawing taken through cooling fins 34-6 and 34-1 of FIG. 4 which shows a modification to the FIG. 4 heat sink.
FIG. 9 is a set of equations which explain a feature of the FIG. 8 heat sink.

Referring now to FIG. 8, still another embodiment of the invention will be described. This embodiment, which is shown in cross section in FIG. 8, is indicated by reference numeral 80. Heat sink 80 has cooling fins which are shaped the same as the cooling fins of heat sink 30 of FIGS. 4 and 5. However, the improved feature of heat sink 80 is that its central section has a convex shape as indicated by reference numeral 81. Suitably, this convex shape is obtained by placing the stamped part of FIG. 5 in a press between one convex member and one concave member.

Due to the convex shape 81, the adhesive 82 which attaches heat sink 80 to substrate 11 is thin at the heat sink's axis 83 and is progressively thicker as the distance from axis 83 increases. Preferably, the adhesive 82 is 0.5 to 2.0 mils thick at the axis 83, and the convex surface 81 is such that it bulges outward at axis 83 by at least one-twentieth of the length of half its cross section. For example, if the edge of the adhesive 82 is 125 mils from axis 83, its thickness should be at least 6.0 mils. This may be achieved by making the cross section of surface 81 a part of a circle, an ellipse, or a parabola.

One feature of the convex shape 81 is that thermal stress is reduced between substrate 11 and heat sink 80 while at the same time, good heat transfer between those components is maintained. This is evident from the equations of FIG. 9. Equation 1 expresses the distance by which a point A on surface 81 will move when it is subjected to a temperature difference. In that equation, $\Delta L_{HS}$ is the distance by which point A moves, $K_{HS}$ is the thermal expansion coefficient of heat sink 80, $L_O$ is the distance of point A from axis 83 before the temperature change, and $\Delta T$ is the temperature change.

Similarly, equation 2 expresses the distance by which a point B will move on substrate 11 when it is subjected to a temperature change. In that equation, $L_{SUB}$ is the distance by which point B moves, $K_{SUB}$ is the thermal expansion coefficient of the substrate, and $L_O$ and $\Delta T$ are as defined above.

Subtracting equation 2 from equation 1 yields equation 3 which gives the distance D that point A moves relative to point B. This relative movement causes members 80, 82, and 11 to deform which in turn produces sheer stress. Equation 4 is a statement of Hook's law which says that the sheer stress (SS) is equal to the shear stress modulus (G) times an angle ($\theta$) by which the material is deformed.

Angle θ is expressed via equation 5 in terms of the distance D and the thickness t of the adhesive 82 between points A and B. Substituting equation 3 and equation 5 into equation 4 yields equation 6. Inspection of equation 6 shows that it contains two variables, $L_O$ and t. All other terms in equation 6 are constant; and so it can be rewritten in simplified form as equation 7.

Equation 7 states that the sheer stress between heat sink 80 and substrate 11 is proportional to the distance $L_O$ and inversely proportional to the thickness t of the adhesive at that distance. Therefore, by making the adhesive 82 progressively thicker towards the perimeter of the central section, the stress is smaller throughout the central portion than it would otherwise be if the central section was flat and the adhesion between it and the substrate was uniformly thin.

On the other hand, if the central portion of the heat sink was flat and the adhesive 82 was made very thick everywhere below the central section in order to relieve thermal stresses, then the cooling ability of the heat sink would be substantially impaired. This is evident by considering the fact that the rate at which heat is transferred from one surface to another is inversely proportional to the thickness of the material between those surfaces. In FIG. 8, the adhesive 82 is very thin below the center of the heat sink, and so the good cooling property that was previously described in conjunction with FIG. 6C is maintained by placing axis 83 directly over the integrated circuit which is to be cooled.

Yet another feature of the convex surface 81 is that it prevents voids from forming in the adhesive 82 during the attachment process. In that process, the adhesive solder or epoxy is heated past the liquefying temperature $T_{HS}$. This causes gas bubbles to form in the adhesive, and they rise upward until they hit surface 81. Then, due to the convex shape 81, the gas bubbles move toward the periphery of the central portion where they escape into the air.

By comparison, when the central portion of a heat sink is flat, the gas bubbles do not move laterally but instead they stay beneath the heat sink. This in turn produces voids between the substrate and the heat sink after the temperature is lowered below $T_{HS}$. Any such void has poor heat-conducting properties, and it also generates micro cracks in the adhesive during temperature cycling.

Still another feature of the convex surface 81 is that it enables the thickness of the adhesive to be reproduced in a mass production environment with a high degree of accuracy. This is because the adhesive at the central axis can easily be made very thin (i.e., within the 0.5 to 2.0 mil range) by simply having the weight of the heat sink or an external weight squash the adhesive in its liquid state. Then, the thickness of the adhesive from axis 83 to the periphery is determined solely by the convex shape 81. This thickness is made symmetrical about the axis 83 by having holes 84 punched in several of the cooling fins, and placing vertical rods in the holes to hold the heat sink upright during the attachment process.

By comparison, when the central section of the heat sink is flat, the thickness of the adhesive between the heat sink and the substrate can be accurately controlled only by providing a very accurate fixture which holds the heat sink by its cooling fins above the substrate at the desired height. Also, for this fixture to work, the cooling fins which the fixture holds must be very accurately bent since if they are too high or too low, the accuracy of the fixture itself will be nullified.

Various preferred embodiments of the invention have now been described in detail. In addition, however, many changes and modifications can be made to these embodiments without departing from the nature and spirit of the invention. For example, while the cross section of FIG. 8 is shown as a modification to the FIG. 5 embodiment, similar modifications can also be made to the embodiments of FIGS. 7A, 7B, 7C and 7G by forming the central section of those embodiments with a convex shape. Holes 84 can also be provided in some of their cooling fins so the heat sinks can readily be stood up vertically during the attachment process. In addition, other heat sinks of the prior art (e.g., the heat sink of FIG. 3) can be modified in accordance with this invention such that their section which attaches to the integrated circuit package has the convex shape 81 of FIG. 8.

Accordingly, it is to be understood that the invention is not limited to the above described detailed embodiments but is defined by the appended claims.

What is claimed is:

1. A heat sink for cooling an integrated circuit package, said heat sink comprising:
   a single thin sheet of material having two oppositely facing major surfaces;
   said major surfaces having a common perimeter defining a central section and a plurality of spaced-apart finger-shaped portions that extend radially from said central section;
   said finger-shaped portions being formed to extend away from said central section to become cooling fins for said central section; and said central section having a convex shape for attachment to a flat surface on said integrated circuit package with an adhesive of nonuniform thickness.

2. A heat sink according to claim 1 wherein the convex shape of said central section bulges outward by at least one-twentieth the length of half of its cross section.

3. A heat sink according to claim 1 wherein the convex shape of said central section has a cross section which is curved like part of a circle, an ellipse, or a parabola.

4. A heat sink according to claim 1 wherein said cooling fins have a set of holes for receiving posts to prevent said heat sink from tipping as it rests on said convex central section.

5. A heat sink according to claim 1 wherein said finger-shaped portions bend away from said central section at an angle of 60°-90°, and thereafter bend in an opposite direction to lie parallel to said central section.

6. A heat sink according to claim 1 wherein said finger-shaped portions bend away from said central section in a gradual, arc-like fashion.

7. A heat sink according to claim 1 wherein all of said finger-shaped portions terminate at the same distance from said central section.

8. A heat sink according to claim 1 wherein said finger-shaped portions terminate in a cyclical fashion at relatively large and relatively small distances from said central section.

9. A heat sink according to claim 1 wherein the said finger-shaped portions twist along respective axes at a predetermined angle.

10. An integrated circuit package comprising: a planar substrate having flat top and bottom surfaces, said top surface having a cavity in which a semiconductor chip is disposed, a lid which covers said cavity and said semiconductor chip and which is sealed by a sealant to said top surface, and a heat sink that is attached by an adhesive to said bottom surface; said heat sink consisting of a single thin sheet of material which is shaped to have a central section and a plurality of spaced-apart finger-shaped sections that extend radially from said central section; said central section being the only part of said heat sink that is attached by said adhesive to said bottom surface, and said finger-shaped sections being curved away from said bottom surface to become cooling fins for said central section; said central section having a convex shape and said adhesive being progressively thicker towards the periphery of said central section.

11. An integrated circuit package comprising a substrate, a heat sink having a central section which is attached via an adhesive to said package, said section having a convex shape which bulges outward by at least one-twentieth the length of half its cross section, and said adhesive being thicker at the periphery of said central section than at its center.

* * * * *